United States Patent [19]

Yokoyama

[11] Patent Number: 4,684,906

[45] Date of Patent: Aug. 4, 1987

[54] SOLID ULTRASONIC DELAY LINE

[75] Inventor: Takeo Yokoyama, Ebina, Japan

[73] Assignee: Showa Electric Wire & Cable Co., Ltd., Japan

[21] Appl. No.: 867,536

[22] Filed: May 28, 1986

[30] Foreign Application Priority Data

Jun. 14, 1985 [JP] Japan ................................ 60-130379
Jul. 17, 1985 [JP] Japan ................................ 60-158865

[51] Int. Cl.$^4$ ............................................. H03H 9/36
[52] U.S. Cl. ..................................... 333/143; 333/142
[58] Field of Search ................................ 333/141–145, 333/147, 149, 186–188; 310/326–328, 333, 357–359, 365–368; 358/20, 21 R, 31, 35, 40, 160, 320, 324, 325, 337, 186–188, 17; 455/18

[56] References Cited

U.S. PATENT DOCUMENTS

| 3,611,200 | 10/1971 | Sliepenbeek et al. | 333/143 |
| 4,016,512 | 4/1977 | Wauk, II | 333/143 |
| 4,525,692 | 6/1985 | Claes | 333/149 |

FOREIGN PATENT DOCUMENTS 0042920  3/1985  Japan ................................ 333/144

Primary Examiner—Marvin L. Nussbaum
Attorney, Agent, or Firm—Pahl, Lorusso & Loud

[57] ABSTRACT

There is disclosed a solid ultrasonic delay line comprising a solid ultrasonic delay medium on which polygonal multiple-reflective surfaces are formed. An input transducer for radiating longitudinal waves is disposed on one of the reflective surfaces. The longitudinal waves are transformed into transverse waves by other one of the reflective surfaces and then reconverted by yet other one of the reflective surfaces into longitudinal waves which enter an output transducer disposed on still other one of the reflective surfaces. Ultrasound absorbers cover at least portions of the main boundary surfaces perpendicular to the reflective surfaces. Spurious waves of the longitudinal waves radiated from the input transducer are transformed by the main boundary surfaces into transverse waves which enter the absorbers. In addition to, or instead of, the absorbers, ultrasound diffuse reflection regions are formed on at least portions of the main boundary surfaces perpendicular to the reflective surfaces, in order to cause the spurious waves of the longitudinal waves from the input transducer to be diffusely reflected at the main boundary surfaces.

7 Claims, 9 Drawing Figures

४,६८४,९०६

SOLID ULTRASONIC DELAY LINE

BACKGROUND OF THE INVENTION

1. Field of the Invention

The present invention relates to a solid ultrasonic delay line and, more particularly, to a solid ultrasonic delay line which has good characteristics, is easy and economical to manufacture, and has a quite high center frequency, say of the order of 100 MHz.

2. Related Art Statement

Solid ultrasonic delay lines for low-frequency signals are known, as described, for example, in Japanese Patent Publication Nos. 27574/1972 and 22818/1971 and U.S. Pat. No. 3,581,247. As shown in FIG. 7, an ultrasonic delay line of this kind has polygonal multiple-reflective surfaces including reflective surfaces 30 and 31. An input transducer 32 and an output transducer 33 are disposed on the reflective surfaces 30 and 31, respectively. Wave-absorbing material is adhered to main boundary surfaces 34 and 35 perpendicular to the reflective surfaces, or diffuse reflection surfaces 36 and 37 are formed on the boundary surfaces 34 and 35, in order to absorb or reflect spurious waves arising from transverse bulk waves which are generally used.

In recent years, high-definition television, for example, has required solid ultrasonic delay lines having quite high center frequencies, say 100 MHz. In order to satisfy this requirement, a delay line as shown in FIG. 8 has been used. Specifically, this delay line has a delay medium M of a thickness t. This thickness is set larger than the thickness of an input transducer 32 and an output transducer 33 so as not to create the possibility that waves 38 having extended side lobes are reflected to produce spurious waves.

In these ultrasonic delay lines shown FIGS. 7 and 8, a portion 39 of the delay medium M is thicker than the input transducer 32 and the output transducer 33. This portion 39 tends to produce spurious waves. Waves incident on the main boundary surfaces of the delay medium make a large incidence angle to the surfaces. Therefore, even when the wave-absorbing material is adhered to them as shown in FIG. 7, the waves are not sufficiently absorbed, but rather they tend to be directly reflected. Further, the delay medium is thick. Delay lines of this structure are fabricated one by one and hence they are expensive to manufacture.

SUMMARY OF THE INVENTION

The above-described drawbacks with the prior art devices have been successfully eliminated by the present invention.

Accordingly, it is an object of the present invention to provide a high-frequency, non-dispersive solid ultrasonic delay line which has good characteristics, is easy and economical to manufacture, and has a quite high center frequency of the order of 100 MHz.

The above object is achieved in accordance with the teachings of the invention by a solid ultrasonic delay line comprising: a solid ultrasonic delay medium; polygonal multiple-reflective surfaces formed on the medium; an input transducer disposed on one of the reflective surfaces and radiating longitudinal waves which are transformed into transverse waves by another one of the reflective surfaces, the transverse waves being transformed back to longitudinal waves by still another one of the reflective surfaces; an output transducer disposed on yet another one of the reflective surfaces and receiving the last-mentioned longitudinal waves; main boundary surfaces perpendicular to the reflective surfaces and transforming spurious waves of the longitudinal waves radiated from the input transducer into transverse waves; and ultrasound absorbers which cover at least portions of the main boundary surfaces and receiving the transverse waves from the main boundary surfaces.

In one feature of the invention, the ultrasound delay line has ultrasound diffuse reflection regions in addition to, or instead of, the ultrasound absorbers on at least portions of the main boundary surfaces perpendicular to the reflective surfaces to cause spurious waves of the longitudinal waves from the input transducer to be diffusely reflected at the main boundary surfaces.

The above and other objects and features of the invention will become apparent from the following description of embodiments thereof when taken in conjunction with the accompanying drawings.

DETAILED DESCRIPTION OF THE PREFERRED EMBODIMENTS

Figure 1:
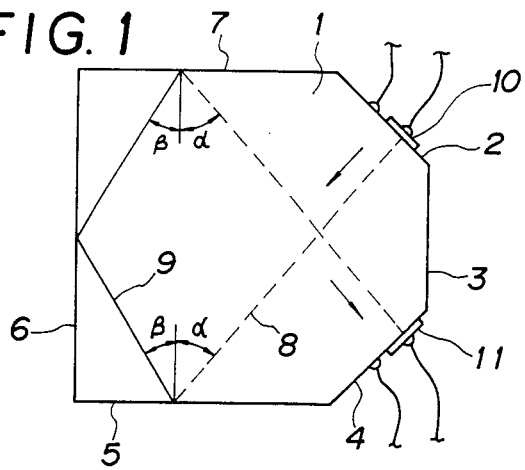
FIG. 1 is a plan view of a solid ultrasonic delay line according to the invention.
Figure 2:
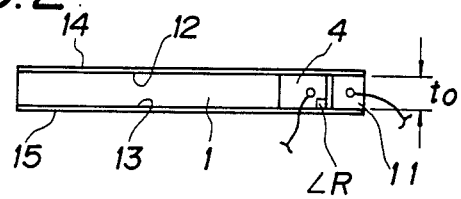
FIG. 2 is a side elevation of the delay line shown in FIG. 1.

Referring to FIGS. 1 and 2, there is shown a solid ultrasonic delay line embodying the concept of the invention. This delay line has a solid ultrasonic delay medium 1, such as glass. Hexagonal multiple-reflective surfaces 2–7 are formed on the medium 1. An input transducer 10 that radiates longitudinal waves 8 indicated by the broken line is disposed on the reflective surface 2. An output transducer 11 is disposed on the reflective surface 4. The longitudinal waves 8 emitted by the input transducer 10 are transformed by the reflective surface 5 into transverse waves 9 indicated by the solid line, and then the waves 9 are converted into longitudinal waves by the reflective surface 7. These longitudinal waves emanating from the surface 7 enter the output transducer 11. Although the multiple-reflective surfaces 2–7 form a hexagon in the illustrated example, these surfaces can take other form according to the amount of delay introduced by the delay line.

Figure 4A:
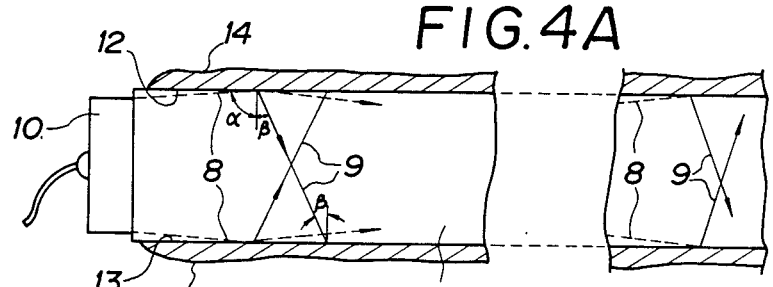
FIG. 4A is a side elevation of the delay line shown in FIG. 2 under the condition in which the line has been completed.

Two parallel main boundary surfaces 12 and 13 are perpendicular to the reflective surfaces 2–7. At least a portion of the boundary surface 12 is covered with an ultrasound absorber 14 (FIG. 4A), such as epoxy resin. Similarly, at least a portion of the boundary surface 13 is covered with an ultrasound absorber 15. In the illustrated example, the surfaces 12 and 13 are almost totally covered with the absorbers 14 and 15, respectively. Spurious waves of the longitudinal waves emitted by the input transducer 10 are transformed into transverse waves by the main boundary surfaces 12 and 13. These transverse waves enter the absorbers 14 and 15. The transducers 10 and 11 have the same thickness of $t_0$ as the delay medium 1, and are perpendicular to the main boundary surfaces 12 and 13 as indicated by ∠R. The boundary surfaces 12 and 13 are smoothed to such an degree that is obtained when they are cut by a sliding machine, such as a wafer sowing machine.

Figure 5:
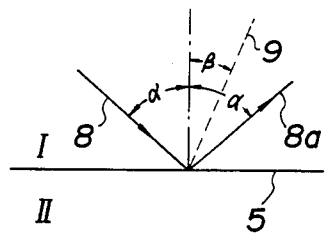
FIG. 5 is a diagram for illustrating the operation of the delay line shown in FIG. 4B.

In the ultrasonic delay line constructed as described above, the longitudinal waves which are radiated from the input transducer 10 on the reflective surface 2 of the delay medium 1 at an angle of 90° to the surface 2 propagate through the medium 1, and then the waves 8 are converted into transverse waves 9 by the other reflective surface 5. The reflected waves 9 travel toward the reflective surface 6. This is next described by referring to FIG. 5.

A solid medium I and a fluid medium II meet at a boundary surface 5. When the longitudinal waves 8 enter the boundary surface 5 at an angle of α, the reflected waves include longitudinal waves 8a and transverse waves 9. The angle at which the longitudinal waves 8a are reflected is equal to the incidence angle α, but the angle β at which the transverse waves 9 are reflected is not equal to the incidence angle. The relation between these reflection angles is given by $$\sin \alpha / \sin \beta = C_{p|} / C_{s|}$$

where $C_{p|}$ is the propagation velocity of the longitudinal waves in the medium I and $C_{s|}$ is the propagation velocity of the transverse waves in the medium I. The ratio of the amplitude of the reflected longitudinal waves 8a to the amplitude of the incident longitudinal waves 8 depends on the incidence angle α. The Poisson ratio of the medium I appears as a parameter in the formula expressing the ratio. When the incidence angle assumes a certain value, the amplitude of the reflected longitudinal waves 8a equals null. Under this condition, the incident longitudinal waves 8 are totally converted into the transverse waves 9. Now let us assume that the medium I is quartz glass whose Poisson ratio is about 0.14 and that the fluid medium II is air. When the incidence angle α is equal to about 45°, the amplitude of the reflected longitudinal waves 8a is null. In this state, the incident longitudinal waves 8 are totally transformed into the transverse waves 9. The reflection angle β of the transverse waves 9 is approximately 30°. The reflection angle α of the longitudinal waves and the reflection angle β of the transverse waves shown in FIG. 1 correspond to their counterparts shown in FIG. 5.

Then, the transverse waves 9 are totally reflected at the reflective surface 6 while kept in the form of transverse waves. Thereafter, the waves 9 are reconverted into longitudinal waves at the reflective surface 7 and then enter the output transducer 11 at an angle of 90° to its surface. The transducer 11 is disposed on the reflective surface 4 of the delay medium 1.

Figure 3:
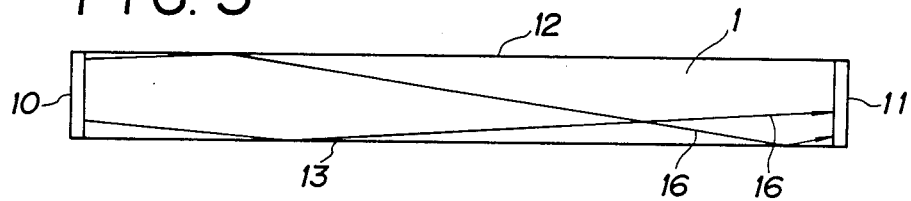
FIG. 3 is a side elevation of the delay line shown in FIG. 2 under the condition in which the line is not yet completed.
Figure 7:
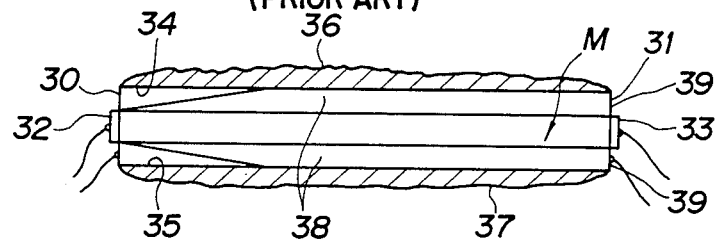
FIGS. 7–8 are side elevations of conventional delay lines.
Figure 8:
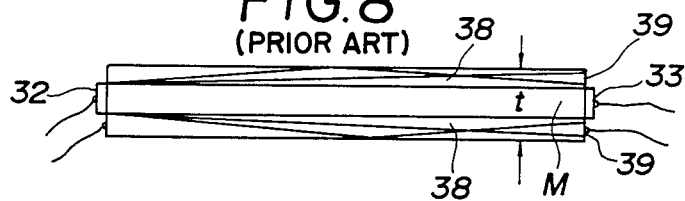

The input transducer 10 and the output transducer 11 of the novel ultrasonic delay line has the same thickness of $t_0$ as the delay medium 1 as mentioned previously. Therefore, the transducers 10 and 11 neither transmit nor receive any mode of waves other than the zeroth-order mode of waves. Thus, the line can be easily fabricated as a non-dispersive mode delay line. However, as shown in FIG. 3, spurious waves 16 which travel substantially parallel to the main boundary surfaces 12 and 13 are produced. In the prior art techniques, these spurious waves were suppressed by the use of the structure shown in FIG. 7 or 8 as described above. In accordance with the invention, at least portions of the main boundary surfaces 12 and 13 are covered with the ultrasound absorbers 14 and 15, respectively. In the illustrated example, substantially the whole boundary surfaces are covered. Therefore, at least a portion of spurious waves of the longitudinal waves 8 which enter the main boundary surfaces 12 and 13 at a very small angle to them after emanating from the input transducer 10 is converted into transverse wave mode as described in connection with FIG. 5, and the direction of propagation is shifted by a large angle. The obtained transverse waves 9 (FIG. 4A) hit the boundary surfaces 12 and 13, or the absorbers 14 and 15, at a small angle of β. Thus, the spurious waves are sufficiently absorbed by the absorbers 14 and 15. The spurious waves may not be completely removed by the main boundary surfaces 12 and 13 when they strike the surfaces once, but the waves are repeatedly reflected at the surfaces 12 and 13 several times to achieve the complete removal of the spurious waves. This conversion of the longitudinal waves into the transverse waves are smoothly effected, because the main boundary surfaces 12 and 13 are flat.

Since the transducers 10 and 11 are perpendicular to the two parallel main boundary surfaces 12 and 13, those waves which are emitted straight by the input transducer 10 travel straight between the boundary surfaces 12 and 13 and enter the output transducer 11.

Figure 4B:
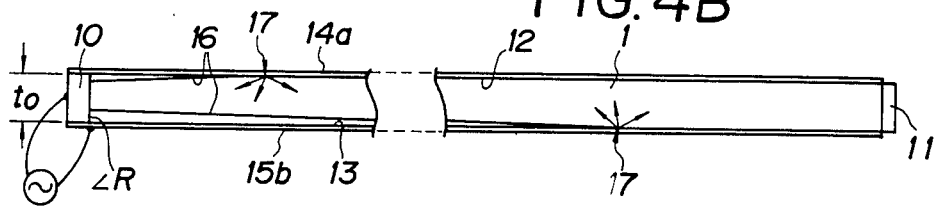
FIG. 4B is a side elevation of another delay line according to the invention under the condition in which the line has been completed.

Referring next to FIG. 4B, there is shown another solid ultrasonic delay line according to the invention. This delay line is similar to the delay line described above except that ultrasound diffuse reflection regions 14a and 15a are formed on at least portions of the two main boundary surfaces 12 and 13 perpendicular to the reflective surfaces 2-7. In the illustrated example, the regions 14a and 15a almost totally cover the boundary surfaces 12 and 13, respectively. These regions 14a and 15a are used instead of, or together with, the aforementioned ultrasound absorbers 14 and 15. The reflection regions 14a and 15a cause spurious waves of the longitudinal waves 16 (FIGS. 3 and 4B) radiated from the input transducer 10 to be diffusely reflected at the boundary surfaces 12 and 13.

The width of the input transducer 10 and the output transducer 11 is equal to the thickness $t_0$ of the delay medium 1. The transducers 10 and 11 are perpendicular to the main boundary surfaces 12 and 13 as indicated by ∠R. It is not necessary that the width of the electrodes (not shown) on the transducer 10 be equal to the thickness $t_0$ of the medium 1.

The roughness of the main boundary surfaces 12 and 13 is one-twentieth to one-fifth of the wavelength λ of the propagated ultrasound. If the surface roughness is less than λ/20 or larger than λ/5, the desired defuse reflection does not take place, producing undesirable result.

In the ultrasonic delay line constructed as described above, the longitudinal waves 8 radiated from the input transducer 10 at an angle of 90° to the surface propagate through the delay medium 1, the transducer 10 being disposed on the reflective surface 2 of the delay medium 1. The longitudinal waves 8 are transformed into transverse waves 9 by other reflective surface 5 and then directed toward still other reflective surface 6 on the same manner as in the above example already described in conjunction with FIG. 5.

The transverse waves 9 are totally reflected at the reflective surface 6 while maintained in the form of transverse waves. Then, the waves are reconverted into transverse waves by yet other reflective surface 7, and enter the output transducer 11 disposed on the reflective surface 4 of the medium 1 at an angle of 90° to the surface.

In the novel ultrasonic delay line constructed as described above, the width of the transducers 10 and 11 is equal to the thickness $t_0$ of the delay medium 1, and therefore the transducers 10 and 11 neither transmit nor receive any mode of waves other than the zeroth-order mode of waves. For this reason, the delay line can be readily manufactured as a non-dispersive mode delay line. However, as shown in FIG. 3, spurious waves 16 traveling substantially parallel to the main boundary surfaces 12 and 13 are produced. In the prior art techniques, the configuration shown in FIG. 7 or 8 was employed to suppress these spurious waves. In accordance with the invention, the ultrasound diffuse reflection regions 14a and 15b cover at least portions of the main boundary surfaces 12 and 13, respectively. In the illustrated example, the boundary surfaces 12 and 13 are almost totally covered with the reflection regions. Therefore, the spurious waves 16 of the longitudinal waves 8 which are emitted from the input transducer 10 and enter the boundary surfaces 12 and 13 at a small angle to these surfaces 12 and 13 are at least partially transformed into transverse waves as already described in connection with FIG. 5. Thus, the transformed transverse waves and the longitudinal waves not transformed are diffusely reflected as indicated by 17 in FIG. 4B. In this way, the spurious waves cancel out around the diffuse reflection regions 14a and 15b. The ultrasound absorbers as made from epoxy resin and used in the above example can be stuck on the diffuse reflection regions 14a and 15b on the main boundary surfaces 12 and 13. In this case, the spurious waves are absorbed at the boundary surfaces 12 and 13. Hence, the spurious waves can be more effectively removed.

Figure 6:
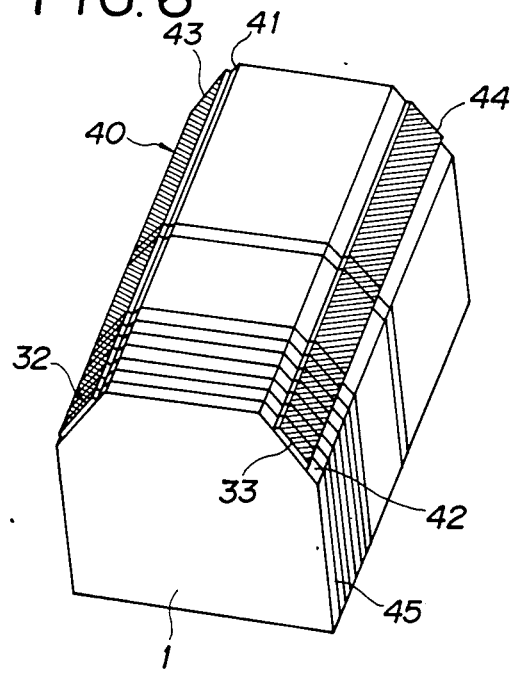
FIG. 6 is a perspective view of the delay line shown in FIG. 4B, for illustrating the manner in which the line is fabricated.

The novel ultrasonic delay line described above is manufactured as follows. As shown in FIG. 6, a block 40 constituting the solid ultrasonic delay line 1 having the polygonal multiple-reflective surfaces 2–7 (FIG. 1) is prepared. The polygon has previously designed dimensions and a certain form. Then, tin electrodes 41 and 42 are attached to the reflective surfaces 2 and 4 by evaporation. An input transducer strip 43 and an output transducer strip 44 are disposed on the electrodes. Under this condition, the delay time is measured. The reflective surface 6 is ground by the required amount. This operation is called the main adjustment. The block is then cut with a slicing machine to obtain units 45 each equipped with the input transducer 10 and the output transducer 11. At this time, the delay time is measured. If necessary, the reflective surface 6 is ground. This operation is called the fine adjustment. Thereafter, epoxy resin serving as the ultrasound absorbers 36 and 37 (FIG. 7) is stuck on the main boundary surfaces on the units 45.

When this manufacturing method is employed, the input and output transducer strips are formed on the block constituting the ultrasonic delay medium having the previously sized polygonal multiple-reflective surfaces. Under this condition, the delay time is adjusted. Subsequently, the whole structure is cut into the units. Hence, the units have the same delay time. Thus, a high quality solid ultrasonic delay line is provided. Since the input and output transducers are cut to the same thickness as the ultrasonic delay medium, the delay line can be readily fabricated as a non-dispersive mode delay line. The main boundary surfaces 12 and 13 can be made flat by cutting the block using a slicing machine, such as a wafer sowing machine.

As can be understood from the above examples, in accordance with the invention, polygonal multiple-reflective surfaces are formed on a solid ultrasonic delay medium. The longitudinal waves radiated from an input transducer are transformed into transverse waves, which are then reconverted into longitudinal waves. These longitudinal waves enter an output transducer. Some of the main boundary surfaces perpendicular to the reflective surfaces are covered with ultrasound absorbers so that spurious waves of the longitudinal waves strike the absorbers after being transformed into transverse waves by the main boundary surfaces. Therefore, waves having extended side lobes can be completely absorbed. Accordingly, only those waves which propagate straight are available from the novel ultrasonic delay line. The characteristics of this line are good. Further, its center frequency is quite high, say of the order of 100 MHz. Hence, the delay line can be used as a non-dispersive delay line of high-frequency signals. Since the delay medium can be fabricated as a thin structure, the amount of the material can be curtailed. Also, the delay line is easy to manufacture, and has a high quality.

Instead of, or in addition to, the aforementioned ultrasound absorbers, ultrasound diffuse reflection regions are formed on at least portions of the main boundary surfaces perpendicular to the reflective surfaces to cause spurious waves of the longitudinal waves radiated from the input transducer to be diffusely reflected at the main boundary surfaces. Consequently, the ultrasonic delay line can completely absorb waves having extended side lobes. Only waves moving straight can be used. The delay line exhibits good characteristics. Its center frequency is quite high, say of the order of 100 MHz. The delay line can be used as a non-dispersive ultrasonic delay line for high frequencies.

Thus, there are provided in accordance with the invention solid ultrasonic delay lines which have the advantages described above. The embodiments described are intended to be merely exemplary and those skilled in the art will be able to make variations and modifications in them without departing from the spirit and scope of the invention. All such modifications and variations are contemplated as falling within the scope of the accompanying claims.

What is claimed is:
1. A solid ultrasonic delay line comprising:
a solid ultrasonic delay medium;
polygonal multiple-reflective surfaces formed on said medium;
an input transducer having one surface disposed on a first of said reflective surfaces and radiating longitudinal waves which are transformed into transverse waves by a second of said reflective surfaces, the transverse waves being transformed back to longitudinal waves by a third of said reflective surfaces;

an output transducer having one surface disposed on a fourth of said reflective surfaces and receiving the last-mentioned longitudinal waves;

main boundary surfaces perpendicular to said reflective surfaces and transforming spurious waves of said longitudinal waves radiated from said input transducer into transverse waves; and ultrasound absorbers which cover at least portions of said main boundary surfaces and which receive the transverse waves from said main boundary surfaces.

2. A solid ultrasonic delay line as set forth in claim 1, wherein said one surface of said input transducer and said one surface of said output transducer have a width which completely spans the thickness of said solid ultrasonic delay medium and are perpendicular to said main boundary surfaces.

3. A solid ultrasonic delay line as set forth in claim 1, wherein said main boundary surfaces are smooth.

4. A solid ultrasonic delay line comprising:
a solid ultrasonic delay medium;
polygonal multiple-reflective surfaces formed on said medium;
an input transducer having one surface disposed on a first of said reflective surfaces and radiating longitudinal waves which are transformed into transverse waves by a second of said reflective surfaces, the transverse waves being transformed back to longitudinal waves by a third of said reflective surfaces;
an output transducer having one surface disposed on a fourth of said reflective surfaces and receiving the last-mentioned longitudinal waves;
main boundary surfaces perpendicular to said reflective surfaces; and
ultrasound diffuse reflection regions formed on at least portions of said main boundary surfaces to cause spurious waves of said longitudinal waves radiated from said input transducer to be diffusely reflected at said boundary surfaces.

5. A solid ultrasonic delay line as set forth in claim 4, wherein said one surface of said input transducer and said one surface of said output transducer have a width which completely spans the thickness of said solid ultrasonic delay medium and are perpendicular to said main boundary surfaces.

6. A solid ultrasonic delay line as set forth in claim 4, wherein the roughness of said main boundary surfaces is in the range from one-twentieth to one-fifth of the wavelength of the propagated ultrasound.

7. A solid ultrasonic delay line comprising:
a solid ultrasonic delay medium;
polygonal multiple-reflective surfaces formed on said medium;
an input transducer having one surface disposed on a first of said reflective surfaces and radiating longitudinal waves which are transformed into transverse waves by a second of said reflective surfaces, the transverse waves being transformed back to longitudinal waves by a third of said reflective surfaces;
an output transducer having one surface disposed on a fourth of said reflective surfaces and receiving the last-mentioned longitudinal waves;
main boundary surfaces perpendicular to said reflective surfaces;
ultrasound diffuse reflection regions formed on at least portions of said main boundary surfaces to cause spurious waves of said longitudinal waves radiated from said input transducer to be diffusely reflected at said boundary surfaces; and
ultrasound absorbers which cover at least portions of said main boundary surfaces.

* * * * *